(12) United States Patent
Shiomi et al.

(10) Patent No.: US 6,391,109 B2
(45) Date of Patent: May 21, 2002

(54) METHOD OF MAKING SIC SINGLE CRYSTAL AND APPARATUS FOR MAKING SIC SINGLE CRYSTAL

(75) Inventors: Hiromu Shiomi, Itami; Shigehiro Nishino, 32, Fukakusa Sekiyashiki-cho, Fushima-ku, Kyoto-shi, Kyoto 612-0037, both of (JP)

(73) Assignees: Sumitomo Electric Industries, Ltd., Osaka; Shigehiro Nishino, Kyoto, both of (JP)

( * ) Notice: Subject to any disclaimer, the term of this patent is extended or adjusted under 35 U.S.C. 154(b) by 0 days.

(21) Appl. No.: 09/750,157

(22) Filed: Dec. 29, 2000

Related U.S. Application Data

(62) Division of application No. 09/231,628, filed on Jan. 15, 1999, now Pat. No. 6,193,797.

(30) Foreign Application Priority Data

Jan. 19, 1998 (JP) .............................. 10-007537
Jan. 26, 1998 (JP) .............................. 10-012646

(51) Int. Cl.$^7$ .............................................. C30B 35/00
(52) U.S. Cl. ....................................... 117/200; 117/906
(58) Field of Search ................................. 117/200, 906

(56) References Cited

U.S. PATENT DOCUMENTS

| | | |
|---|---|---|
| RE34,861 E | 2/1995 | Davis et al. |
| 5,463,978 A | 11/1995 | Larkin et al. |
| 5,707,446 A * | 1/1998 | Volkl et al. .............. 117/200 |
| 5,746,827 A | 5/1998 | Barrett et al. |
| 5,944,890 A | 8/1999 | Kitou et al. |
| 5,964,943 A | 10/1999 | Stein et al. |
| 5,964,944 A * | 10/1999 | Sugiyama et al. .......... 117/107 |
| 5,968,261 A * | 10/1999 | Barrett et al. ............... 117/13 |
| 5,985,024 A * | 11/1999 | Balakrishna et al. ......... 117/84 |
| 6,045,613 A | 4/2000 | Hunter et al. |
| 6,056,820 A * | 5/2000 | Balakrishna et al. ....... 117/200 |
| 6,063,185 A * | 5/2000 | Hunter ....................... 117/84 |
| 6,086,672 A * | 7/2000 | Hunter ....................... 117/84 |
| 6,110,279 A * | 8/2000 | Kito et al. ................. 117/105 |

FOREIGN PATENT DOCUMENTS

| | | | |
|---|---|---|---|
| EP | 0712150 | 5/1996 | |
| JP | 59-35099 | 2/1984 | |
| JP | 5-105596 | 4/1993 | |
| JP | 5-58774 | 9/1993 | |
| JP | 9-268099 | 10/1997 | |
| JP | 00-319098 A * | 11/2000 | ........... C30B/25/00 |
| WO | WO97/13013 | 4/1997 | |

OTHER PUBLICATIONS

*Silicon Carbide*, edited by R.C. Marshall, et al., 1973.

* cited by examiner

Primary Examiner—Benjamin L. Utech
Assistant Examiner—Matthew Anderson
(74) Attorney, Agent, or Firm—Smith, Gambrell & Russell, LLP

(57) ABSTRACT

An apparatus comprises an Si-disposing section in which solid Si is disposed; a seed-crystal-disposing section in which a seed crystal of SiC is disposed; a synthesis vessel adapted to accommodate the Si-disposing section, the seed-crystal-disposing section, and carbon; heating means adapted to heat the Si-disposing section and the seed-crystal-disposing section; and a control section for transmitting to the heating means a command for heating the Si to an evaporation temperature of Si or higher and heating the seed crystal to a temperature higher than that of Si; wherein the Si evaporated by the heating means is adapted to reach the seed-crystal-disposing section.

13 Claims, 7 Drawing Sheets

METHOD OF MAKING SIC SINGLE CRYSTAL AND APPARATUS FOR MAKING SIC SINGLE CRYSTAL

This application is a division of application Ser. No. 09/231,628 filed Jan. 15, 1999 now U.S. Pat. No. 6,193,797, which is incorporated herein in its entirety by reference.

BACKGROUND OF THE INVENTION

1. Field of the Invention

The present invention relates to a method of making an SiC single crystal and apparatus for making an SiC single crystal in which high-quality SiC suitable for semiconductor electronic components is grown.

2. Related Background Art

Being a material excellent in resistance to chemicals such as acids and alkalis, less likely to be damaged by high energy radiation, and yielding a high durability, SiC has been used as a semiconductor material.

In order for SiC to be used as a semiconductor material, it is necessary to obtain a high-quality single crystal thereof having a certain order of dimensions. Conventionally utilized as a method of growing an SiC single crystal of the aimed scale is Acheson method employing a chemical reaction or Lely method employing sublimation/recrystallization technique.

In particular, as a method of growing a bulk of SiC single crystal, Japanese Patent Publication No. 59-48792, for example, discloses so-called modified Lely method in which, in a crucible made of graphite, an SiC single crystal of appropriate dimensions is used as a seed crystal, and material SiC powder is sublimed in an atmosphere under a reduced pressure, so as to be recrystallized on the seed crystal, whereby an SiC single crystal of the aimed scale is grown.

SUMMARY OF THE INVENTION

Of the above-mentioned conventional methods, the Acheson method heats a mixture of silica and coke in an electric furnace and deposits the crystal due to naturally occurring nucleation, thus yielding a large amount of impurities and making it difficult to control the form of resulting crystal and crystal faces, whereby it is hard to produce high-quality SiC single crystals.

Also, in the case where an SiC single crystal is made by the Lely method, since the crystal is grown due to naturally occurring nucleation, it is difficult to control the form of crystal and crystal faces.

On the other hand, an SiC single crystal having a considerably good quality can be obtained in accordance with the invention disclosed in the above-mentioned Japanese Patent Publication No. 59-48792, which belongs to the modified Lely method. When the SiC single crystal is obtained by this method, however, SiC crystals naturally occur from the graphite crucible during the crystal growth period. Using these SiC crystals as nuclei, crystals rapidly grow and inhibit the crystal growth from the seed crystal, thus making it difficult to yield a crystal with a high homogeneity.

Further, there is a problem that, under the influence of heat radiation, the temperature of the upper face of the material becomes higher than that within the material, whereby the amount of sublimation is large at the early stage of growth and gradually decreases as the surface is graphitized. In order to overcome this problem, Japanese Patent Application Laid-Open No. 5-105596 proposes to make a material contain carbon and further form a surface portion of the material with a layer containing carbon, thereby preventing heat radiation from occurring from the upper part of the crucible. Even in this method, however, it is difficult to effect such control that the material consistently reaches the seed crystal under the same vapor pressure during the synthesis, whereby the production of a high-quality SiC single crystal cannot be expected.

Also, the area where the material is sublimed upon heating by the heat conduction or heat radiation from the crucible gradually expands from the material in the vicinity of the part in contact with the side face or bottom face of the crucible to the material located at the center part. Since the part of material in the vicinity of the side face or bottom face of the crucible sublimed in the early stage changes into highly heat-insulating soot-like powder as the sublimation area expands, however, the heat conduction and heat radiation to the material at the center part would decrease drastically, whereby the sublimation of the material at the center part may diminish suddenly or fail to occur. In particular, for synthesizing a single crystal having a large area, the crucible for charging the material is required to have a large diameter as well, whereby the radial alteration of material would be a severe problem. Though the growth apparatus disclosed in Japanese Patent Application Laid-Open No. 5-58774 aims at uniformly heating the material by installing a heat conductor within the crucible, it cannot restrain the SiC material from subliming so as to change into soot-like powder, thus failing to keep crystallizing speed from changing over time in principle, whereby the manufacture of high-quality SiC single crystal cannot be expected in this apparatus, either.

FIG. 5 is a graph showing vapor pressure curves of carbon (C) and SiC, in which the ordinate (on a logarithmic scale) and the abscissa indicate pressure (Pa) and temperature (°C.), respectively. As shown in FIG. 5, the vapor pressure of Si is higher than that of $SiC_2$ or $Si_2C$ occurring during the generation of SiC by one digit. For enhancing the SiC-forming speed, it is necessary to supply a sufficient amount of Si and C to the seed crystal. In this case, however, there is a problem that, if the material temperature is raised so as to increase the partial pressures of $SiC_2$ and $Si_2C$, which have low vapor pressures, in order to sufficiently supply C, the partial pressure of the Si system will be so high that the stoichiometry (stoichiometric composition) of the material and synthesized crystal may shift.

WO9713013A discloses an epitaxial growth method in which a high-speed jet of silane gas is sprayed onto an SiC substrate within high-temperature hot walls. The SiC single crystal can be grown at a high speed in this technique. Since Si is supplied by a gas, however, there occurs a problem that hydrogen etches SiC within the high-temperature hot walls. Also, the silane gas may form particles in the vapor phase, thus contaminating the inside of the apparatus and degrading the SiC single crystal.

FIG. 6 shows the temperature dependence of Si partial pressure in a major reaction in which SiC grows in thermal CVD of SiC. From this graph, it can be seen that, as the hydrogen partial pressure rises, the reverse reaction for SiC growth proceeds, whereby SiC is etched. Namely, when the hydrogen partial pressure is high, it becomes difficult to form a high-quality SiC single crystal.

In view of such conventional problems, it is an object of the present invention to provide a method of making an SiC single crystal and an apparatus for making an SiC single crystal in which a high-quality SiC single crystal can be obtained.

In order to overcome the above-mentioned problems, the present invention provides a method of making an SiC single crystal, the method comprising a disposing step of disposing solid Si with in a first temperature area $T_1$, and disposing a seed crystal of SiC within a second temperature area $T_2$ that is higher than the first temperature area $T_1$; an Si-evaporating step of evaporating Si from the first temperature area $T_1$; an SiC-forming-gas-generating step of generating an SiC-forming gas by reacting thus evaporated Si and carbon; and a single-crystal-forming step of causing the SiC-forming gas to reach the seed crystal so as to form the SiC single crystal.

First, in the method of making an SiC single crystal in accordance with the present invention, solid Si is evaporated as being heated by the first temperature area $T_1$. Here, as the temperature of the first temperature area $T_1$, is regulated, the partial pressure of Si can be adjusted. Subsequently, thus evaporated Si is reacted with carbon, where by an SiC-forming gas is generated. As the SiC-forming gas reaches the seed crystal of SiC, the SiC single crystal is formed. Here, if the partial pressure of carbon to combine with the evaporated Si is made substantially the same as the partial pressure of Si determined by the temperature of the first temperature area $T_1$, a high-quality SiC single crystal can be obtained.

Also, since a solid source of Si is used, the partial pressure of hydrogen in the atmosphere decreases, thereby eliminating the problem that the SiC single crystal is etched. Further, since unstable gases such as silane are not used as the SiC source, there would be no problem of particles being formed upon decomposition of the gases in the vapor phase. As a consequence, Si can sufficiently be supplied, so as to enable high-speed growth and make it possible to prevent the SiC single crystal from degrading due to the particles.

Here, it can be seen from FIG. 6 that, as the hydrogen partial pressure decreases, the reaction proceeds in the direction causing SiC to grow. Since the flux amount ($cm^{-1}s^{-1}$) of Sic can be calculated from its partial pressure, assuming that all of the flux contributes to growth, it can be seen that a growth rate as high as several hundred $\mu m/h$ is expectable.

Preferably, in the method of making an Sic single crystal in accordance with the present invention, solid carbon is disposed in a third temperature area $T_3$ at a temperature higher than that in the second temperature area $T_2$ in the disposing step; the Si-forming gas is formed by causing the Si evaporated in the Si-evaporating step to pass through the third temperature area $T_3$ and react with carbon in the SiC-forming-gas-generating step; and the SiC-forming gas is caused to reach the seed crystal in the single-crystal-forming step to form the SiC single crystal.

Namely, in this case, the partial pressure of Si can be adjusted by regulating the temperature of the first temperature area $T_1$, and the partial pressure of carbon can be made substantially the same as that of Si by regulating the temperature of the third temperature area $T_3$. In general, in order for the partial pressure of carbon and the partial pressure of Si to become identical to each other, it is necessary for carbon to have a temperature higher than that of Si. Here, since the temperatures of Si and carbon are raised independently of each other, a sufficient amount of carbon can be supplied to the seed crystal while suppressing the amount of evaporation of Si. As the seed crystal, a single crystal substrate of SiC may also be used.

FIG. 7 is a graph showing the respective vapor pressure curves of Si and C, in which the ordinate (on a logarithmic scale) and the abscissa indicate pressure (Pa) and temperature (°C.), respectively. As can be seen from FIG. 7, as Si which can yield a sufficient vapor pressure at 1400° C. and over is caused to pass through the area of C (graphite) heated to 2000° C. or higher, the SiC single crystal can be synthesized with a favorable controllability.

Also, highly pure materials are inexpensively available for solid Si and C (graphite), which are raw materials, respectively. Therefore, the concentration of impurities in the SiC single crystal being synthesized can greatly be lowered. Further, since each of material Si and C is a single element, unlike the case using SiC powder, no composition changes would occur during synthesis, whereby the synthesizing condition becomes stable, thus allowing a high-quality SiC single crystal to be obtained. Also, since the materials at the time of filling are not in the form of powder but solid (bulk) of Si and graphite, the filling ratio is so high that a large, elongated SiC single crystal can be synthesized.

Silicon Carbide-1973, p. 135 (Proceedings of the Third International Conference on Silicon Carbide held at Miami Beach, Fla. on Sep. 17–20, 1973) discloses that an SiC single crystal with a good quality was obtained when the temperature of molten Si was 2200° C. in the state where the growth chamber in which SiC was formed had a temperature of 2500° C. The heater used in the growth apparatus disclosed in this literature, however, had only one zone, and the temperature of molten Si was not forcibly adjusted to but only turned out to be 2200° C., thus being greatly different from the present invention in this regard.

Preferably, in the present invention, a shield made of carbon, quartz, or SiC is disposed at a boundary between Si in a liquid phase and Si in a vapor phase in the first temperature area $T_1$, so as to control the vapor pressure of Si. Here, as carbon, glass-like carbon (glassy carbon) is suitable in particular, which forms an excellent shield without reacting with Si even at a high temperature.

Preferably, the above-mentioned shield and solid carbon in the third temperature area $T_3$ are mechanically connected to each other, such that, as the shield changes its position along with a decrease in the amount of Si caused by evaporation of Si in the first temperature area $T_1$, carbon migrates so that the distance between the formed SiC single crystal and carbon is kept substantially constant. Employing such a configuration enables an SiC single crystal to be formed stably for a long period of time.

Preferably, solid carbon in the third temperature area $T_3$ is formed with a through hole through which evaporated Si can pass. Using carbon formed with a through hole such as capillary or slit would increase the area at which evaporated Si comes into contact with carbon, thus allowing Si and carbon to react with each other efficiently.

Preferably, in the method of making an SiC single crystal in accordance with the present invention, Si and the seed crystal of SiC are disposed in a gas containing carbon in the disposing step, the evaporated Si is reacted with a carbon component in the gas to form the Sic-forming gas in the SiC-forming-gas-generating step; and the SiC-forming gas is caused to reach the seed crystal in the single-crystal-forming step, so as to form the SiC single crystal.

Namely, in this case, the partial pressure of Si can be adjusted by regulating the temperature of the first temperature area $T_1$, and the partial pressure of carbon can be made substantially the same as that of Si by regulating the amount of supply of the gas containing carbon, whereby a high-quality SiC single crystal substrate can be obtained. Here, as the seed crystal, a substrate of single crystal SiC may be used.

Preferably, a shield made of carbon, quartz, or SiC is disposed at the boundary between Si in the liquid phase and Si in the vapor phase in the first temperature area $T_1$, so as to control the vapor pressure of Si. Here, as carbon, glass-like carbon (glassy carbon) is suitable in particular, which forms an excellent shield without reacting with Si even at a high temperature.

Preferably, an argon gas is used as a carrier gas of the Si evaporated from the first temperature area $T_1$. Using the argon gas as the carrier gas can prevent by-products from being generated.

Preferably, in the single-crystal-forming step, the seed crystal is rotated at 100 rpm or over. Thus rotating the seed crystal at a high speed can minimize the film thickness distribution and further enables high-speed growth. It is due to the fact that the rotation would thin the diffusion layer of the substrate surface, thereby increasing the driving force for diffusion. As a consequence, the growth rate can be increased without using a proximity method such as sandwich technique.

The apparatus for making an SiC single crystal in accordance with the present invention comprises an Si-disposing section in which solid Si is disposed; a seed-crystal-disposing section in which a seed crystal of SiC is disposed; a synthesis vessel adapted to accommodate the Si-disposing section, the seed-crystal-disposing section, and carbon; heating means adapted to heat the Si-disposing section and the seed-crystal-disposing section; and a control section for transmitting to the heating means a command for heating the Si to an evaporation temperature of Si or higher and heating the seed crystal to a temperature higher than that of the Si, wherein the Si evaporated by the heating means is adapted to reach the seed-crystal-disposing section.

In the apparatus for making an SiC single crystal in accordance with the present invention, Si is evaporated by the heating means receiving the command from the control section. Here, as the heating temperature of Si is regulated, the partial pressure of Si can be adjusted. Subsequently, thus evaporated Si is reacted with carbon, whereby an SiC-forming gas is generated. Then, as the SiC-forming gas reaches the seed crystal disposed in the seed-crystal-disposing section, the SiC single crystal is formed. Here, if the partial pressure of carbon is made substantially the same as the partial pressure of Si, then a high-quality SiC single crystal can be obtained.

Preferably, in the apparatus for making an SiC single crystal in accordance with the present invention, solid carbon is disposed between the Si-disposing section and seed-crystal-disposing section in the synthesis vessel, the control section controls the heating means such that the temperature of solid carbon becomes higher than that of the seed crystal, and the Si evaporated by the heating means is adapted to reach the seed crystal by way of the solid carbon.

When such a configuration is employed, the partial pressure of Si can be adjusted by regulating the heating temperature of Si, and the partial pressure of carbon can be made substantially the same as that of Si by regulating the heating temperature of carbon, whereby a high-quality SiC single crystal substrate can be obtained.

Preferably, the apparatus for making an SiC single crystal in accordance with the present invention is configured such that the synthesis vessel is adapted to accommodate a gas containing carbon, the Si evaporated by the heating means reacts with carbon in a carbon component in the gas so as to generate the SiC-forming gas, and the SiC-forming gas is adapted to reach the seed crystal.

When such a configuration is employed, the partial pressure of Si can be adjusted by regulating the heating temperature of Si, and the partial pressure of carbon can be made substantially the same as that of Si by regulating the amount of supply of the gas containing carbon to the synthesis vessel, whereby a high-quality SiC single crystal substrate can be obtained.

Preferably, in the apparatus for making an SiC single crystal in accordance with the present invention, an inner face of the synthesis vessel is formed from diamond-like carbon or glass-like carbon. This can suppress natural nucleation in the inner face of the synthesis vessel, thus allowing a high-quality SiC single crystal to be synthesized.

Preferably, a heat shield made of graphite is disposed outside the synthesis vessel. This can suppress the heat dissipation caused by heat radiation.

Preferably, the heat shield is made of a plurality of rectangular graphite sheets disposed close to each other with a gap therebetween, such as to yield substantially a cylindrical form as a whole. This can suppress the induced current caused by high-frequency heating. Further, if a plurality of such heat shields are disposed radially of the synthesis vessel, then the heat dissipation and induced current can further be suppressed.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

In the following, preferred embodiments of the method of making an SiC single crystal and apparatus for making an SiC single crystal in accordance with the present invention will be explained in detail.

First Embodiment

Figure 1:
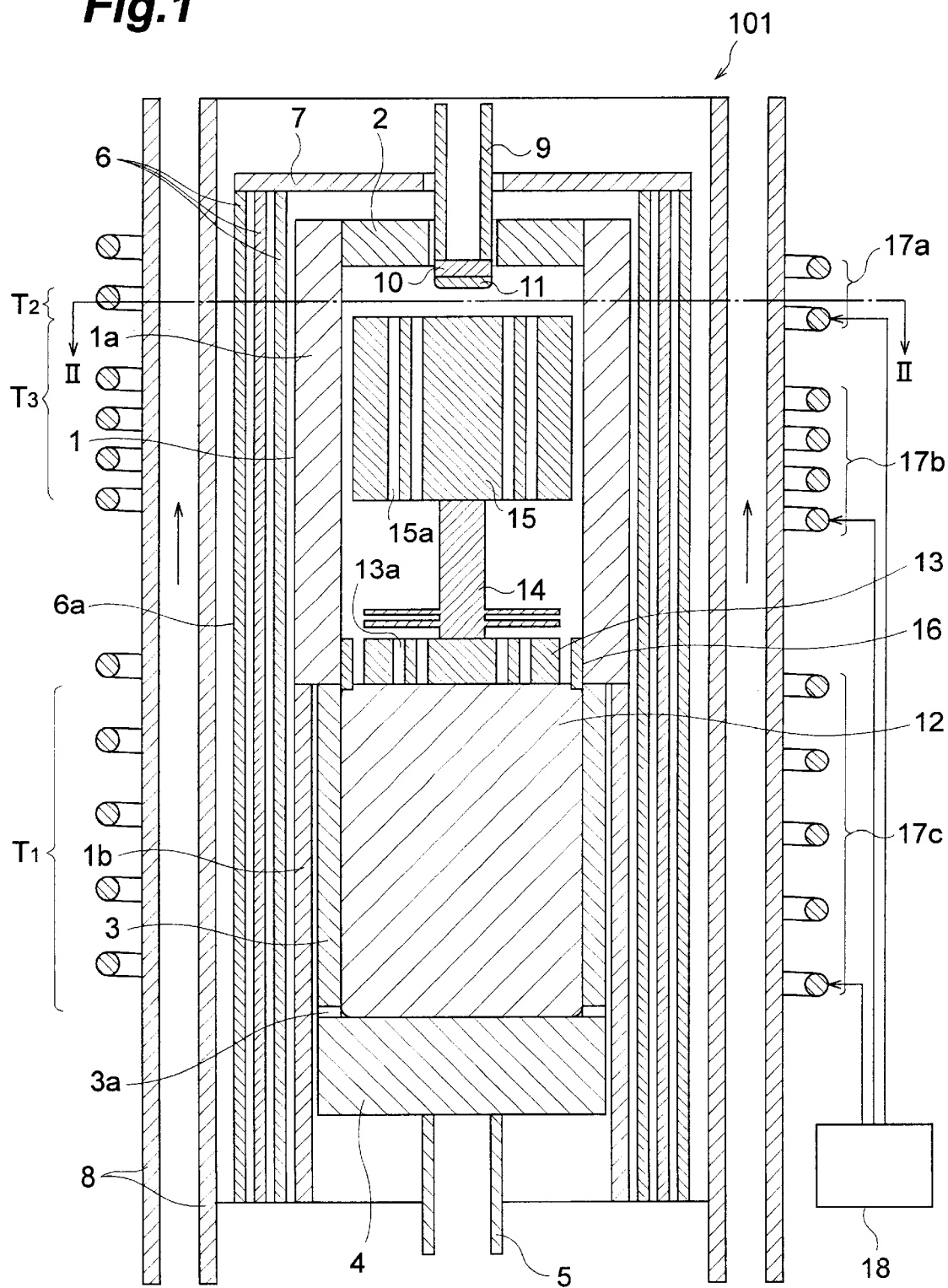
FIG. 1 is a schematic configurational view showing the apparatus for making an SiC single crystal in accordance with a first embodiment of the present invention.
Figure 2:
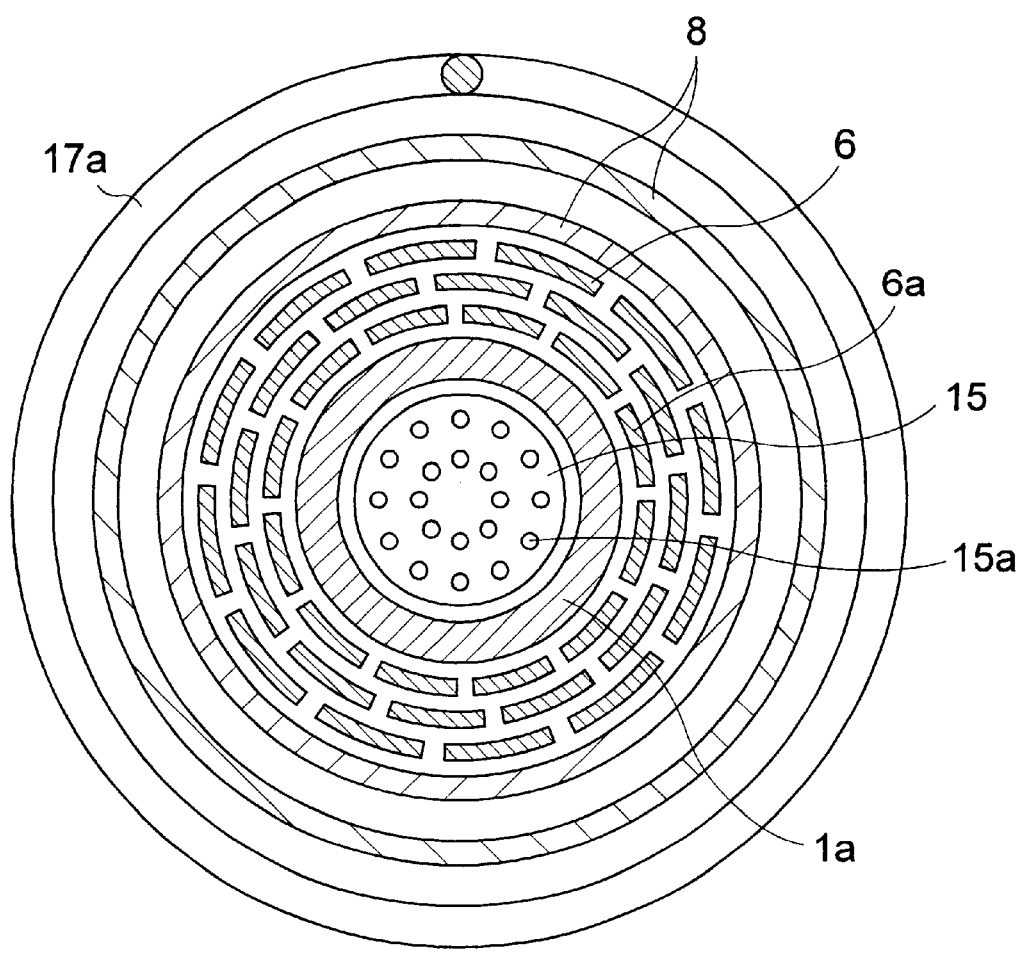
FIG. 2 is a sectional view of the apparatus for making an SiC single crystal taken along the II—II direction.

FIG. 1 is a view showing an apparatus for making an SiC single crystal 101, whereas FIG. 2 is a sectional view of the apparatus 101 shown in FIG. 1 taken along the II—II direction. In the apparatus 101, a crucible 1, which is a cylindrical synthesis vessel made of graphite, is constituted by an upper crucible 1a and a lower crucible 1b each having a cylindrical form. The upper end of the upper crucible 1a is closed with a disk-shaped lid 2. Inside the lower crucible 1b, on the other hand, a cylindrical Si-holding crucible 3 made of graphite is inserted so as to be axially movable with a slight gap from the lower crucible 1b. The lower part of the Si-holding crucible 3 is fixedly attached to the upper face of a disk-shaped crucible support 4, whereas the lower side face of the Si-holding crucible 3 is provided with a plurality of through holes 3a communicating with the above-mentioned gap. Here, the Si-supporting crucible 3 and the crucible support 4 constitute an Si-disposing section. Fixedly attached to the center part of the lower face of the crucible support 4 is a cylindrical support shaft 5 connected to a drive source which is not shown. Namely, as the support shaft 5 moves up and down, the Si-supporting crucible 3 can move axially. Also, since the support shaft 5 has a hollow cylindrical form, the temperature of the bottom face of the Si-holding crucible 3 can be measured with a two-temperature pyrometer.

The inner peripheral faces of the crucible 1 and Si-holding crucible 3 are formed from diamond-like carbon or glass-like carbon (glassy carbon) having a high smoothness. Preferably, the inner peripheral faces of the crucible 1 and Si-holding crucible 3 have a surface roughness of $R_{max} < 10$ μm.

Outside the crucible 1, three pieces of heat shields 6 are disposed concentrically, aligning in radial directions of the crucible 1. As shown in FIG. 2, each heat shield 6 is formed by a plurality of substantially rectangular (strip-shaped) graphite sheets 6a disposed close to each other with a gap therebetween, such as to yield substantially a cylindrical form as a whole, whereas the neighboring heat shields 6 are disposed such that their gaps would not overlap radially. Since the heat shields 6 are not formed from carbon fiber or porous graphite which is often used in general and causes impurity contamination, there is no fear of impurity contamination. Further, as shown in FIG. 1, the upper end of these heat shields 6 is closed with a disk-shaped lid 7 formed from the same material.

Outside the outermost heat shield 6, a cylindrical quartz tube 8 made of quartz is disposed concentrically with the heat shields 6. A coolant such as water is allowed to flow through the quartz tube 8, thus protecting the latter. Outside the quartz tube 8, RF work coils 17a, 17b, 17c, which function as heating means, are successively disposed from the upper side so as to enable high-frequency heating of the crucible 1, Si-holding crucible 3, and the like. Also, a control section 18 for effecting temperature adjustment of the work coils 17a to 17c is connected thereto.

Into the crucible 1, at the upper part thereof, a cylindrical seed-crystal-supporting rod 9 penetrating through the center parts of the lid 7 and lid 2 is inserted so as to be axially movable. To the lower end of the seed-crystal-supporting rod 9, a disk-shaped seed crystal holder 10 is fixedly attached such as to close the lower end opening thereof. To the lower face of the seed crystal holder 10, which functions as a seed-crystal-disposing section, a seed crystal 11 of SiC is fixedly attached with a paste made of glucose which has been melted at a high temperature. Since the seed-crystal-supporting rod 9 has a hollow cylindrical form, the temperature of the seed crystal 11 can be measured with a two-temperature pyrometer. Also, the seed-crystal-supporting rod 9 is disposed such as to be axially rotatable at a speed as high as 200 rpm. The seed-crystal-supporting rod 9 is constituted such as to be able to attain a vacuum state as a whole, together with the crucible 1, crucible support 4, and support shaft 5, within the range surrounded by the inner wall of the quartz tube 8. As the seed crystal, a substrate of SiC single crystal may be disposed in the seed crystal holder 10.

On the other hand, an Si source 12 in a cylindrical bulk is accommodated within the Si-holding crucible 3. On the upper face of the Si source 12, a disk-shaped shield 13 for regulating Si vapor pressure made of carbon, quartz, or SiC is mounted. The shield 13 for regulating Si vapor pressure is formed with a plurality of passage holes 13a axially penetrating therethrough such as to allow Si vapor to pass therethrough. To the upper face of the shield 13 for regulating Si vapor pressure, at the center part thereof, an auxiliary shield 14 for regulating Si vapor pressure formed from the samematerial as the shield 13 for regulating Si vapor pressure is fixedly attached. The auxiliary shield 14 for regulating Si vapor pressure is constituted by a center shaft, and two disks disposed near the shield 13 for regulating Si vapor pressure. For regulating the vapor pressure from the Si source 12, the shield 13 for regulating Si vapor pressure and the auxiliary shield 14 for regulating Si vapor pressure can control the area of the boundary between Si in the liquid phase melted at a high temperature and Si in the vapor phase and control the diffusion of Si in the vapor phase, respectively.

To the upper end part of the auxiliary shield 14 for regulating Si vapor pressure, a carbon supply source (graphite) 15 in a cylindrical bulk form is fixedly attached. The carbon supply source 15 is formed with passage holes 15a axially penetrating therethrough, thus allowing Si vapor to pass therethrough. While passing through the passage holes 15a, Si reacts with graphite, thereby yielding an SiC-forming gas which is an active species for forming SiC. The descending movement of the carbon supply source 15 is restricted by a drop stopper 16 fixedly disposed at the lower inner peripheral face of the upper crucible 1a even when the Si-holding crucible 3 falls down.

In thus configured apparatus 101, according to the command from the control section 18, heating control can be effected such that the temperature of the Si source 12 is set to 1300° C. to 1600° C. by the work coil 17c, the temperature of the seed crystal 11 is set to 2000° C. to 2400° C. by the work coil 17a, and the temperature of the carbon supply source 15 is set to 2300° C. to 3000° C. by the work coil 17b. Namely, this apparatus 101 is configured such that three areas consisting of a low-temperature area (first temperature area) $T_1$ for the Si source 12, a medium-temperature area (second temperature area) $T_2$ for the seed crystal 11, and a high-temperature area (third temperature area) $T_3$ for the carbon supply source 15 can be formed within the crucible 1.

In this apparatus 101, the through holes 3a of the Si-holding crucible 3 are configured such that the Si source 12 is melted due to a high temperature so as to partially flow out from the through holes 3a and block them as being solidified at the gap to the lower crucible 1b, whereby Si vapor is efficiently guided upward.

With reference to FIG. 1, a method of making an SiC single crystal by using thus configured apparatus 101 for making an SiC single crystal will now be explained.

First, after the seed crystal 11, the Si source 12, the carbon supply source 15, and the like were set to their predetermined positions, the seed-crystal-supporting rod 9 was moved up to lift the seed crystal 11, the Si source 12 was moved down together with the Si-supporting crucible 3, and then evacuation was effected for an hour in the space formed inside the inner wall of the quartz tube 8. Subsequently, an Ar gas was caused to flow into the apparatus 101 such as to yield a normal pressure (760 Torr) and, with coolant flowing through the quartz tube 8, the crucible 1 was set to 2800° C. and baked for an hour, so as to effect degassing. Here, graphite in the carbon supply source 15 can be baked at the same time since it remains within the crucible 1 due to the drop stopper 16 of the carbon supply source 15.

Subsequently, the Si source 12 was moved up together with the Si-holding crucible 3 so as to attain the state shown in FIG. 1, the seed-crystal-supporting rod 9 and the seed crystal 11 were moved down to a predetermined position, and then, with the seed-crystal-supporting rod 9 being rotated at 100 rpm, the control section 18 was operated to adjust the work coils 17a to 17c such that the seed crystal 11, graphite in the carbon supply source 15, and the Si source 12 attained temperatures of about 2300° C., about 2500° C., and about 1600° C., respectively. As the temperature setting is thus effected at the normal pressure, crystals with inferior crystallinity can be prevented from growing. Also, as the temperatures of the Si source 12 and carbon supply source 15 are thus set, the partial pressure of Si and the partial pressure of carbon in the apparatus 101 can be made substantially identical to each other.

Thereafter, the pressure inside the inner wall of the quartz tube 8 was lowered to 5 Torr in the Ar gas atmosphere, and this state was maintained, so as to cause Si vapor to pass through the passage holes 13a of the shield 13 for regulating Si vapor pressure and further through the passage holes 15a of the carbon supply source 15, thus making an SiC-forming gas. As the SiC-forming gas reached the seed crystal 11, an SiC single crystal grew on the surface of the seed crystal 11 at a rate of 1 to 2 mm/h, whereby a bulk of SiC single crystal having a diameter of 2 inches in accordance with this embodiment was finally formed.

In this embodiment, since the partial pressure of Si and the partial pressure of carbon are made substantially identical to each other, a high-quality SiC single crystal can be obtained. Also, since the inner peripheral surfaces of the crucible 1 and Si-holding crucible 3 are formed from diamond-like carbon or glass-like carbon as mentioned above, they can restrain natural nucleation from occurring in the inner face of the upper crucible 1a, whereby the high-quality SiC single crystal can be formed.

Also, since a solid source of Si is used, the partial pressure of hydrogen within the crucible 1 decreases, whereby there is substantially no problem of the SiC single crystal being etched. Further, since no unstable gases such as silane are used as the Si source, there would be no problems of particles caused by decomposition of the gases in the vapor phase. As a consequence, a sufficient amount of Si can be supplied, so as to enable high-speed growth, and the SiC single crystal can be prevented from degrading due to the particles.

Also, since the heat shields 6 made of graphite are disposed outside the crucible 1, the heat dissipation caused by heat radiation can be suppressed. Further, since the heat shield 6 comprises a plurality of graphite sheets 6a disposed with a gap therebetween, so as to yield substantially a cylindrical form as a whole, it can suppress the induced current caused by high-frequency heating. Also, since a plurality of such heat shields 6 are disposed radially of the crucible 1, the heat dissipation and induced current can further be suppressed.

Further, since the carbon supply source 15 is formed with the passage holes 15a, the area at which evaporated Si comes into contact with carbon increases, thus allowing Si and carbon to react with each other efficiently. Further, since the shield 13 for regulating Si vapor pressure and the carbon supply source 15 are mechanically connected to each other, the carbon supply source 15 moves down as the Si source 12 decreases, so that the distance between the synthesized SiC single crystal and the carbon supply source 15 is kept substantially constant, whereby the formation of SiC single crystal can be effected stably for a long period of time.

When investigating the photoluminescence characteristic of thus obtained SiC single crystal, its peak wavelength was found to be about 490 nm, thereby indicating it to be a 6H-type SiC single crystal.

Upon Hall measurement, electric characteristics were found to be such that a high-resistance, low-carrier-density SiC single crystal having a resistivity of 8 Ωcm, a carrier density of about $3\times10^{16}$ cm$^{-3}$, and n-type conduction could be synthesized.

Further, this bulk of SiC single crystal was sliced into a wafer having a thickness of 400 μm, which was then polished with diamond grindstone such that both sides were mirror-finished. As a result, it was found to be homogenous in the whole surface of 2 inches upon visual observation, and polycrystallization from edges and light transmissibility of the crystal were found to be favorable at a wavelength of 2 to 5 μm, thus indicating this crystal to be a good crystal which did not take a large amount of impurities therein.

In this embodiment, as mentioned above, since the respective temperatures of the Si source 12 and carbon supply source 15 are separately raised, and their vapor pressures are regulated at their corresponding optimal temperatures so as to effect synthesis, a high temperature can be set in the high-temperature area $T_3$ independently of the amount of supply of Si, whereby the SiC single crystal can efficiently be synthesized. Also, the Si source 12 and the carbon supply source 15 can be made of highly pure materials which are inexpensively available as a bulk, can greatly reduce the concentration of impurities, and can synthesize a large-size, elongated SiC single crystal. Further, since each of the Si source 12 and graphite of the carbon supply source 15 is a single element, the synthesizing condition becomes stable, whereby a high-quality SiC single crystal can be obtained. Also, since the seed-crystal-supporting rod 9 can be rotated at a speed as high as 200 rpm, the in-plane homogeneity can be enhanced, and diffusion can be accelerated, so as to raise the growth rate.

Though the method of making an SiC single crystal and apparatus for making an SiC single crystal in accordance with the present invention are explained in detail with reference to the above-mentioned embodiment in the foregoing, the present invention should not be restricted to the above-mentioned embodiment. For example, as the means for heating the synthesis vessel such as crucible, resistance heating or. the like may be used in place of the RF work coils. Also, it is not necessary for the passage holes for Si vapor formed in. the carbon supply source to have a circular cross section, and solid carbon may be formed with a slit as well.

Second Embodiment

Figure 3:
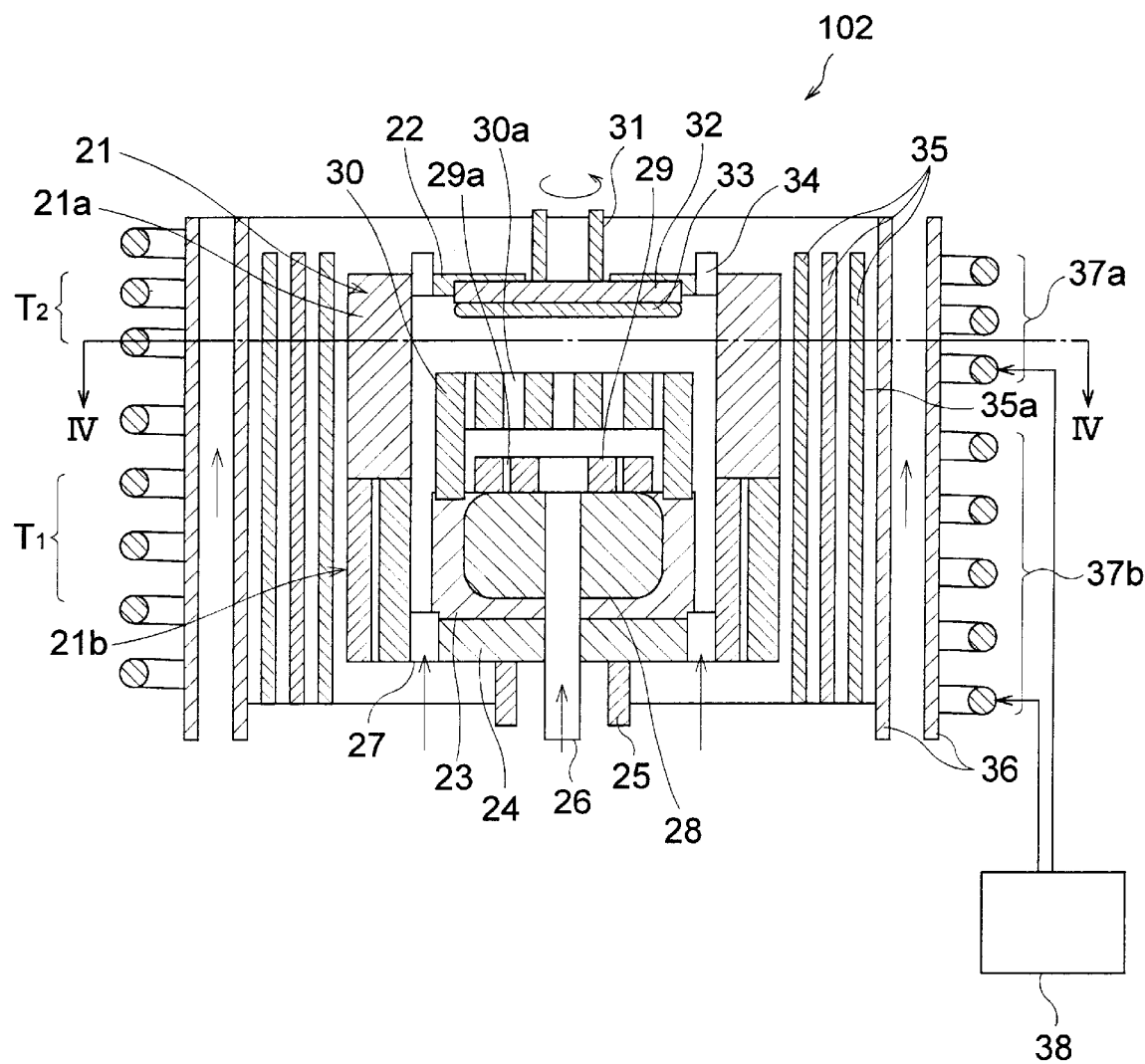
FIG. 3 is a schematic configurational view showing the apparatus for making an SiC single crystal in accordance with a second embodiment of the present invention.
Figure 4:
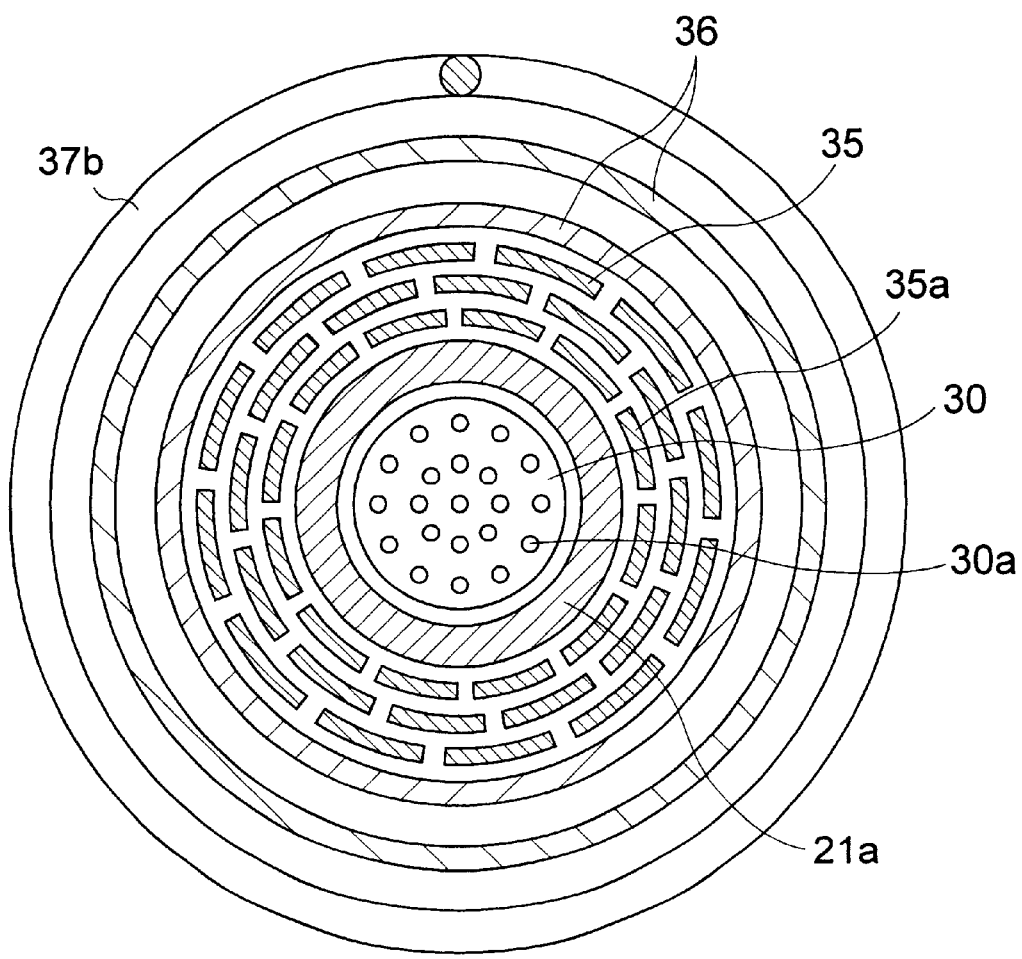
FIG. 4 is a sectional view of the apparatus for making an SiC single crystal taken along the IV—IV direction.
Figure 5:
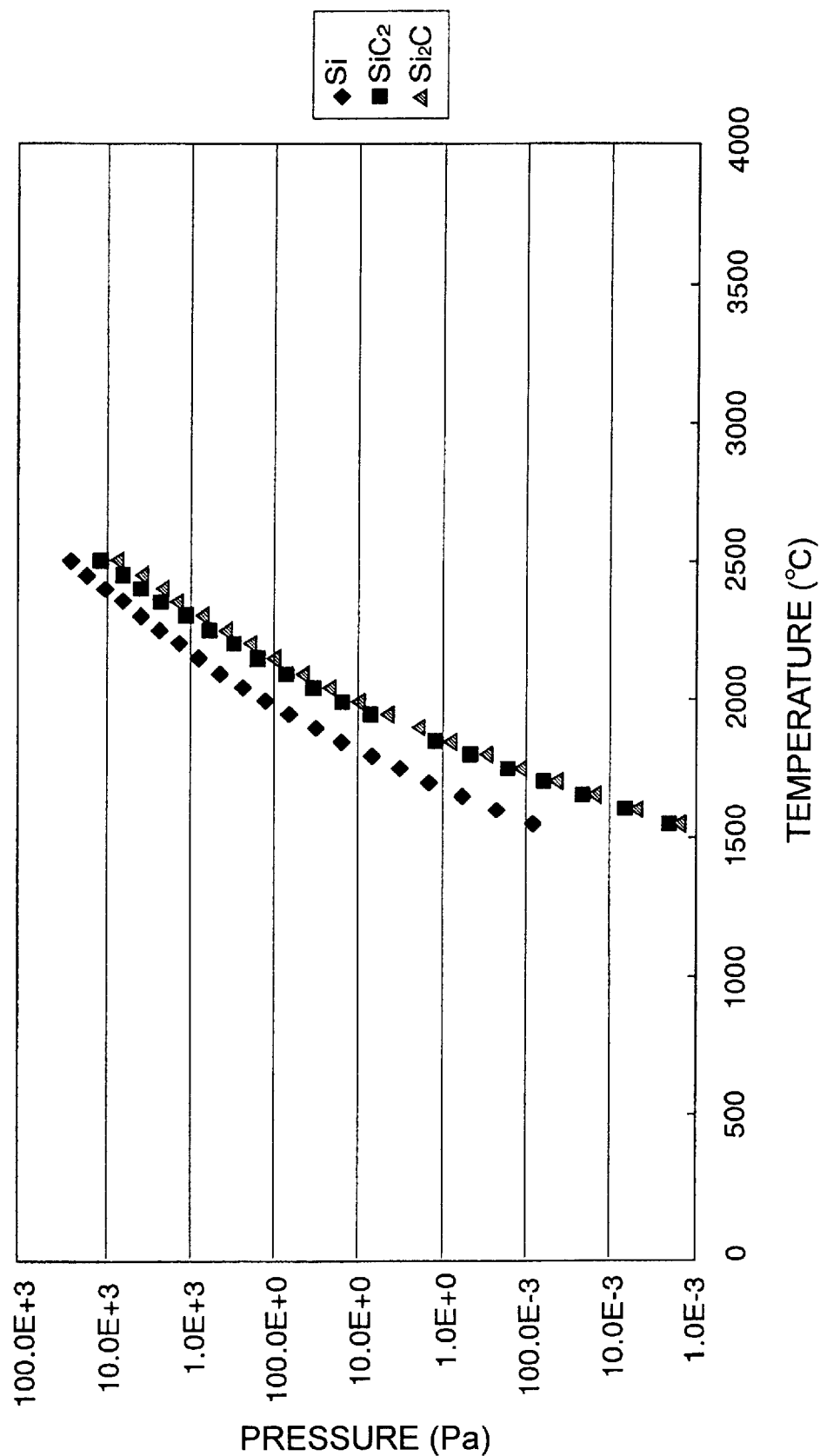
FIG. 5 is a graph showing vapor pressure curves of C and SiC.
Figure 6:
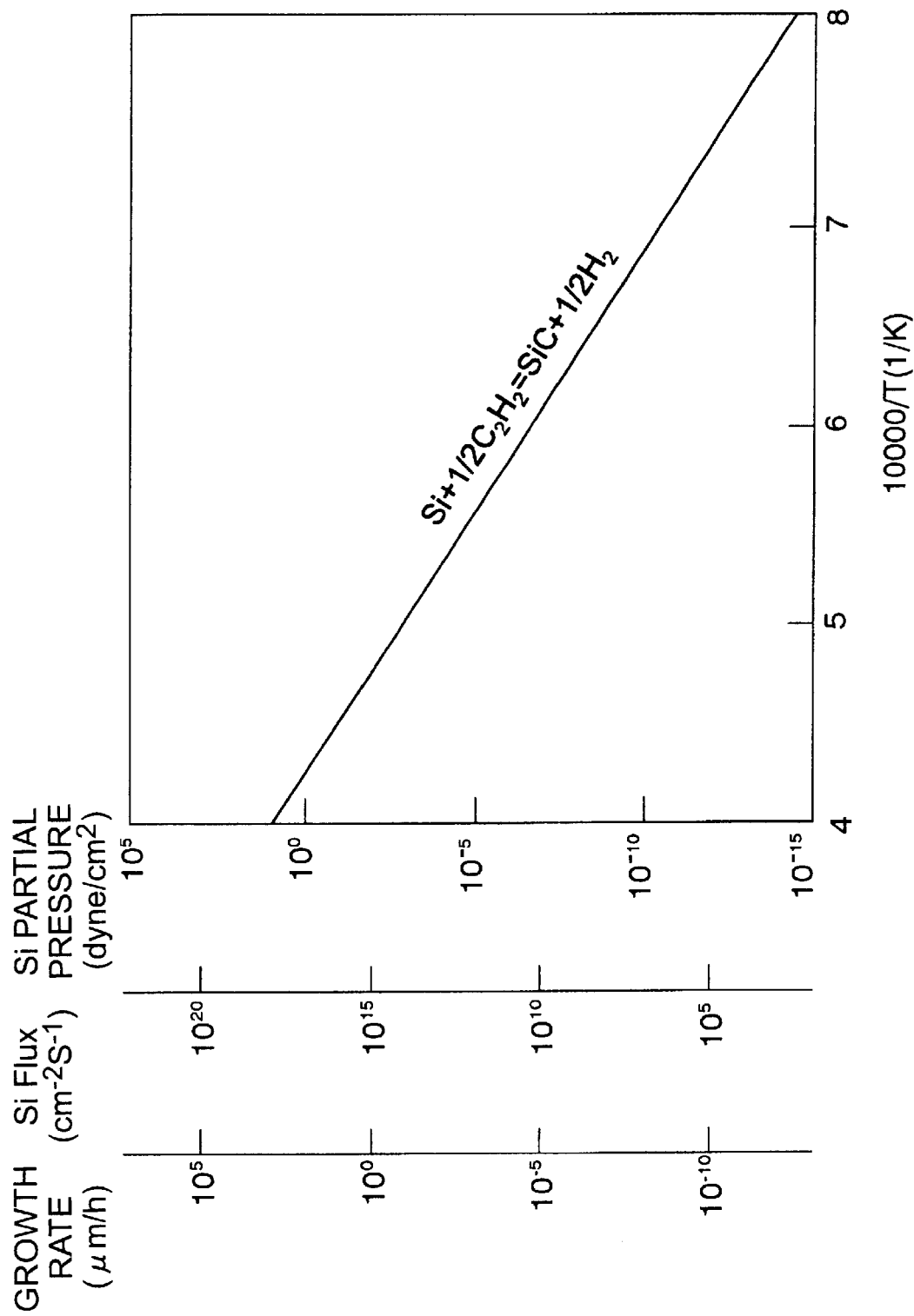
FIG. 6 is a graph showing the temperature dependence of Si partial pressure in a major reaction in which SiC grows in thermal CVD of SiC.
Figure 7:
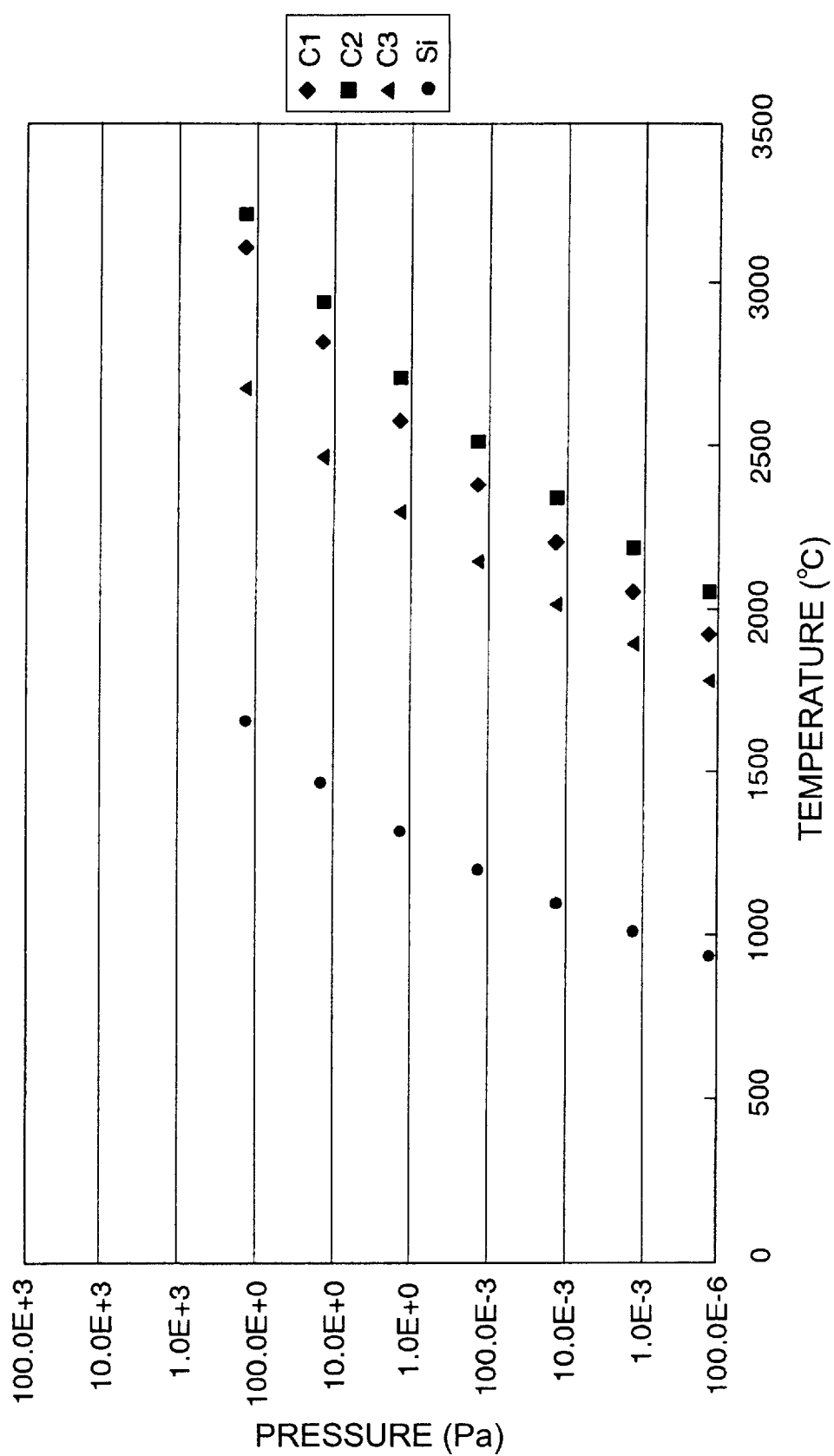
FIG. 7 is a graph showing vapor pressure curves of C and SiC.

FIG. 3 is a view showing an apparatus 102 for making an SiC single crystal in accordance with this embodiment, whereas FIG. 4 is a sectional view of the apparatus shown in FIG. 3 taken along the IV—IV direction.

In this apparatus 102, a hot wall 21, which is a cylindrical synthesis vessel made of graphite, is constituted by an upper hot wall 21a and a lower hot wall 21b each having a cylindrical form. The upper end of the upper hot wall 21a is closed with a disk-shaped lid 22. On the other hand, the lower hot wall 21b has a double structure in which two cylinders radially align with each other with a slight gap therebetween. Each of the inner peripheral faces of the upper hot wall 21a and lower hot wall 21b is formed from diamond-like carbon or glass-like carbon (glassy carbon) having a high smoothness. Preferably, the inner peripheral faces of the upper hot wall 21a and lower hot wall 21b have a surface roughness of $R_{max}<10$ μm.

Inside the lower hot wall 21b, an Si-accommodating crucible (Si-disposing section) 23, having a bottomed cylinder form made of graphite, is inserted so as to be axially movable with a gap from the lower hot wall 21b. The lower part of the Si-accommodating crucible 23 is fixedly attached to the upper face of a disk-shaped crucible support 24 which is slidable along the inner peripheral face of the lower hot wall 21b, whereas a cylindrical support shaft 25 connected to a drive source not shown is fixedly attached to the center part of the lower face of crucible support 24. Namely, as the support shaft 25 moves up and down, the Si-accommodating crucible 23 can move axially. Also, since the support shaft 25 has a hollow cylindrical form, the temperature of the bottom face of the Si-accommodating crucible 23 can be measured with a two-temperature pyrometer.

The center parts of the support shaft 25, crucible support 24, and crucible 23 are provided with an Ar gas supply pipe 26 for supplying an Ar gas as a carrier gas. Also, the outer periphery of the crucible support 24 is provided with a plurality of hydrocarbon supply holes 27 for supplying hydrocarbon as a gas containing carbon which axially penetrate therethrough.

Within the crucible 23, a solid Si source 28 is accommodated. On the upper face of the Si source 28, a disk-shaped shield 29 for regulating Si vapor pressure made of carbon, quartz, or SiC is mounted. The shield 29 for regulating Si vapor pressure is formed with a plurality of passage holes 29a axially penetrating therethrough so as to allow Si vapor to pass therethrough. This shield 29 is used for regulating the area of the boundary between Si in the melted liquid phase and Si in the vapor phase, in order to control the vapor pressure from the Si source 28.

To the upper part of the crucible 23, a disk-shaped control plate 30 for uniformly supplying Si vapor is fixedly attached. This control plate 30 is made of the same material as the shield 29, such that the upper end of a cylinder vertically disposed on the crucible 23 is provided with a disk, which is formed with a plurality of passage holes 30a axially penetrating therethrough.

On the other hand, into the hot wall 21 at the upper part thereof, a cylindrical substrate-holder-supporting rod 31 penetrating through the center part of the lid 22 is inserted so as to be axially movable. To the lower end of the substrate-holder-supporting rod 31, a disk-shaped substrate holder (seed-crystal-disposing section) 32 is fixedly attached such as to close the lower end opening thereof. To the lower face of the substrate holder 32, a substrate 33 of SiC single crystal, which is a seed crystal, is fixedly attached with a paste made of glucose which has been melted at a high temperature. Since the support-holding rod 31 has a hollow cylindrical form, the temperature of the substrate 33 can be measured with a two-temperature pyrometer. Also, the substrate-holding rod 31 is disposed such as to be axially rotatable at a speed as high as 1500 rpm. The outer periphery of the lid 22 is provided with a plurality of gas exhaust holes 34, axially penetrating therethrough, for exhausting gases.

Outside the hot wall 21, as shown in FIG. 4, three pieces of heat shields 35 are disposed concentrically, aligning in radial directions of the hot wall 21. Each heat shield 35 is formed by a plurality of strip-shaped graphite sheets 35a disposed close to each other with a gap therebetween, such as to yield substantially a cylindrical form as a whole, whereas the neighboring heat shields 35 are disposed such that their gaps would not overlap radially. Since the heat shields 35 are not formed from carbon fiber or porous graphite which is often used in general and causes impurity contamination, there is no fear of impurity contamination.

Outside the outermost heat shield 35, a cylindrical quartz tube 36 made of quartz is disposed concentrically with the heat shields 35. A coolant such as water is allowed to flow through the quartz tube 36, thus protecting the latter. Outside the quartz tube 36, RF work coils 37a, 37b, which function as heating means, are successively disposed from the upper side so as to enable high-frequency heating of the hot wall 21 and the like. Also, a control section 38 for effecting temperature adjustment of the work coils 37a, 37b is connected thereto.

Here, the hot wall 21, heat shields 35, and so forth are configured such as to be able to attain a vacuum state as a whole within the range surrounded by the inner wall of the quartz tube 36.

In thus configured apparatus 102, according to the command of the control section 38, heating control can be effected such that the temperature of the Si source 28 is set to 1300° C. to 1600° C. by the work coil 37b and the temperature of the substrate 33 is set to 1500° C. to 2200° C. by the work coil 37a. Namely, this apparatus 102 is configured such that two areas consisting of a low-temperature area (first temperature area) $T_1$ for the Si source 28 and a high-temperature area (second temperature area) $T_2$ for the substrate 33 can be formed within the hot wall 21.

With reference to FIG. 3, a method of making an SiC single crystal by using thus configured apparatus 102 for making an SiC single crystal will now be explained.

First, after the Si source 28, the substrate 33 of SiC single crystal, and the like were set to their predetermined positions, the substrate-holder-supporting rod 31 was moved up to lift the substrate 33, the Si source 28 was moved down together with the crucible 23, and then evacuation was effected for an hour in the space formed inside the inner wall of the quartz tube 36. Subsequently, an Ar gas was caused to flow into the apparatus 101 such as to yield a normal pressure (760 Torr) and, with coolant flowing through the quartz tube 36, the hot wall 21 was set to 2800° C. and baked for an hour, so as to effect degassing.

Subsequently, the Si source 28 was moved up together with the crucible 23 so as to attain the state shown in FIG. 3, the substrate-holder-supporting rod 31 and the substrate 33 were moved down to their predetermined positions, and then, with the substrate-holder-supporting rod 31 being rotated at 1000 rpm, the control section 38 was operated to adjust the workcoils 37a, 37b such that the substrate 33 and the Si source 28 attained temperatures of about 2300° C. and about 1450° C., respectively. As the temperature setting is effected at such a normal pressure, crystals with inferior crystallinity can be prevented from growing.

Thereafter, the pressure inside the inner wall of the quartz tube 16 was lowered to 5 Torr in the Ar gas atmosphere and, with this state being maintained, the Ar gas as the carrier gas was caused to flow from the Ar gas supply pipe 26, thereby causing Si vapor to pass through the passage holes 29*a* of the shield 29 and further through the passage holes 30*a* of the control plate 30. Thereafter, Si vapor was reacted with hydrocarbon supplied from the hydrocarbon supply hole 27 in the vicinity of the substrate 33. Then, the SiC-forming gas generated by the reaction between Si and the carbon component contained in hydrocarbon was caused to reach the substrate 33, so as to grow an SiC single crystal on the surface of the substrate 33 at a rate of 100 $\mu$m/h, whereby an epitaxial film of SiC single crystal having a diameter of 2 inches and a thickness of 0.5 mm in accordance with this embodiment was finally formed.

In this embodiment, by adjusting the amount of hydrocarbon supplied from the hydrocarbon supply hole 27, the partial pressure of evaporated Si determined by the heating temperature of the work coil 37*a* and the partial pressure of carbon contained in hydrocarbon can be made substantially identical to each other. As a consequence, a high-quality SiC single crystal can be obtained.

Further, since the inner peripheral surfaces of the upper hot wall 21*a* and lower hot wall 21*b* are formed from diamond-like carbon or glass-like carbon as mentioned above, they can restrain natural nucleation from occurring in the inner face of the hot wall 21, whereby a high-quality SiC single crystal can be formed.

Also, since a solid source of Si is used, the partial pressure of hydrogen within the hot wall 21 decreases, whereby there is substantially no problem of the SiC single crystal being etched. Further, since no unstable gases such as silane are used as the Si source, there would be no problems of particles caused by decomposition of the gases in the vapor phase. As a consequence, a sufficient amount of Si can be supplied, so as to enable high-speed growth, and the SiC single crystal can be prevented from degrading due to the particles.

Also, since the heat shields 35 made of graphite are disposed outside the hot wall 21, the heat dissipation caused by heat radiation can be suppressed. Further, since the heat shield 35 comprises a plurality of graphite sheets 35*a* disposed with a gap therebetween, so as to yield substantially a cylindrical form as a whole, it can suppress the induced current caused by high-frequency heating. Also, since a plurality of such heat shields 35 are disposed radially of the hot wall 21, the heat dissipation and induced current can further be suppressed.

Also, Si, hydrocarbon, and the like can be made of highly pure materials which are inexpensively available, and can greatly reduce the concentration of impurities in the epitaxially grown film. Further, since the substrate-holder-supporting rod 31 and the substrate 33 are rotated at 100 rpm or over, the film thickness distribution can be made uniform, so as to allow the in-plane homogeneity to enhance, and diffusion can be accelerated, so as to raise the growth rate.

When investigating the photoluminescence characteristic of thus obtained epitaxial film, its peak wavelength was found to be about 490 nm, thereby indicating it to be a 6H-type SiC epitaxial film. Also, upon Hall measurement, electric characteristics were found to be such that a high-resistance, low-carrier-density epitaxial film having a resistivity of 1000 $\Omega$cm, a carrier density of about $3\times10^{14}$ cm$^{-3}$, and n-type conduction could be synthesized. Further, when the substrate on the rear side was shaved off so as to investigate the light transmissibility of this epitaxial film, it was found to be favorable at a wavelength of 2 to 5 $\mu$m, thus indicating this epitaxial film to be a good crystal which did not take a large amount of impurities therein.

As explained in the foregoing, in the method of making an SiC single crystal and apparatus for making an SiC single crystal in accordance with the present invention, since the temperature of solid Si is raised independently of the temperature of carbon, the partial pressure of Si and the partial pressure of carbon can be made substantially identical to each other, whereby a high-quality SiC single crystal can be obtained.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An apparatus for making an SiC single crystal in which the SiC single crystal is formed, said apparatus comprising:

an Si-disposing section in which solid Si is disposed;

a seed-crystal-disposing section in which a seed crystal of SiC is disposed;

a synthesis vessel adapted to accommodate said Si-disposing section, said seed-crystal-disposing section, and carbon;

heating means adapted to heat said Si-disposing section and said seed-crystal-disposing section, wherein, at an upper face of said Si disposed in said Si-disposing section, a shield made of carbon quartz, or SiC having passage holes that allow said Si evaporated by said heating means to pass therethrough is disposed; and a control section for controlling said heating means, wherein said Si evaporated by said heating means is adapted to reach said seed-crystal-disposing section.

2. An apparatus for making an SiC single crystal according to claim 1, wherein:

solid carbon is disposed between said Si-disposing section and seed-crystal-disposing section in said synthesis vessel;

said control section controls said heating means; and said Si evaporated by said heating means is adapted to reach said seed crystal by way of said solid carbon.

3. An apparatus for making an SiC single crystal according to claim 1, further comprising connecting means for mechanically connecting said shield and said solid carbon to each other, wherein, as said shield changes a position thereof along with a decrease in said Si caused by evaporation in said Si-disposing section, said carbon migrates so that the distance between the SiC single crystal formed on said seed crystal and said carbon is kept substantially constant.

4. An apparatus for making an SiC single crystal according to claim 2, wherein said solid carbon is formed with a through hole through which said evaporated Si can pass.

5. An apparatus for making an SiC single crystal according to claim 2, wherein an inner face of said synthesis vessel comprises diamond-like carbon or glass-like carbon.

6. An apparatus for making an SiC single crystal according to claim 1, wherein a heat shield made of graphite is disposed outside said synthesis vessel.

7. An apparatus for making an SiC single crystal according to claim 6, wherein said heat shield is made of a plurality of rectangular graphite sheets disposed close to each other with a gap therebetween, such as to yield substantially a cylindrical form as a whole.

8. An apparatus for making an SiC single crystal according to claim 6, wherein a plurality of said heat shields are disposed radially of said synthesis vessel.

9. An apparatus for making an SiC single crystal according to claim 1, wherein said synthesis vessel is adapted to accommodate a gas containing carbon and a SiC-forming gas said SiC-forming gas being adapted to reach said seed crystal.

10. An apparatus for making an SiC single crystal according to claim 9, wherein an inner face of said synthesis vessel comprises diamond-like carbon or glass-like carbon.

11. An apparatus for making an SiC single crystal according to claim 9, wherein a heat shield made of graphite is disposed outside said synthesis vessel.

12. An apparatus for making an Sic single crystal according to claim 11, wherein said heat shield is made of a plurality of rectangular graphite sheets disposed close to each other with a gap therebetween, such as to yield substantially a cylindrical form as a whole.

13. An apparatus for making an Sic single crystal according to claim 11, wherein a plurality of said heat shields are disposed radially of said synthesis vessel.

* * * * *